United States Patent [19]

Alleven et al.

[11] Patent Number: 6,124,750
[45] Date of Patent: Sep. 26, 2000

[54] CURRENT SENSING GATED CURRENT SOURCE FOR DELAY REDUCTION IN A UNIVERSAL SERIAL BUS (USB) LOW SPEED OUTPUT DRIVER

[75] Inventors: Gary W. Alleven, Eden Prairie; Alex T. Siagian, Minneapolis, both of Minn.

[73] Assignee: Cypress Semiconductor Corp., San Jose, Calif.

[21] Appl. No.: 08/995,494

[22] Filed: Dec. 22, 1997

[51] Int. Cl.[7] .......................... H03K 17/296; G05F 1/10
[52] U.S. Cl. ............................ 327/394; 327/538
[58] Field of Search ................... 327/54, 56, 63, 327/67–70, 72–74, 78–83, 87–90, 108, 112, 392–395, 399, 400, 378, 530, 538, 541, 543, 546

[56] References Cited

U.S. PATENT DOCUMENTS

| | | | |
|---|---|---|---|
| 4,775,807 | 10/1988 | Bukowski, Jr. | 327/72 |
| 5,175,451 | 12/1992 | Ihara | 327/54 |
| 5,300,837 | 4/1994 | Fischer | 307/491 |
| 5,434,533 | 7/1995 | Furutani | 327/538 |
| 5,675,813 | 10/1997 | Holmdahl | 395/750 |
| 5,774,013 | 6/1998 | Groe | 327/543 |
| 5,790,331 | 8/1998 | Aranovsky | 360/46 |
| 5,796,276 | 8/1998 | Phillips et al. | 327/108 |
| 5,796,278 | 8/1998 | Osborn et al. | 327/108 |

FOREIGN PATENT DOCUMENTS 9736230  10/1997  WIPO .

OTHER PUBLICATIONS

Gary W. Alleven, U.S.S.N. 08/934,933 Methods, Circuits and Devices for reducing and/or Improving Crossover Performance and/or Monotonicity, and Applications of the Same in a Universal Serial Bus (USB) Low Speed Output Driver, filed Sep. 22, 1997.

Gary W. Alleven, U.S.S.N. 08/934,805 Methods, Circuits and Devices for Reducing and/or Improving Crossover Performance and/or Monotonicity, and Applications of the Same in a Universal Serial Bus (USB) Low Speed Output Driver, filed Sep. 22, 1997.

Gary W. Alleven, U.S.S.N. 08/935,350 Methods, Circuits and Devices for Reducing and/or Improving Crossover Performance and/or Monotonicity, and Applications of the Same in a Universal Serial Bus (USB) Low Speed Output Driver, filed Sep. 22, 1997.

Design Guide for a Low Speed Buffer for the Universal Serial Bus.

Revision 1.1, Dec., 1996 Intel Corporation, pp. 1–29.

Universal Serial Bus Specification, Chapter 7—Electrical, Jan. 15, 1996, pp. 111–143.

*Primary Examiner*—My-Trang Nuton
*Attorney, Agent, or Firm*—Christopher P. Mariorana, P.C.

[57] ABSTRACT

A circuit comprising a comparator circuit and a control circuit. The comparator circuit may be configured to present an output signal in response to (i) a reference current and (ii) a control current. The control circuit may be configured to generate the control current in response to (i) a first current source configured to present a fixed portion of the control current, (ii) a second current source configured to present a variable portion of the control current and (iii) a sense transistor. The second current source generally responds to a level of said control current.

14 Claims, 4 Drawing Sheets

6,124,750

CURRENT SENSING GATED CURRENT SOURCE FOR DELAY REDUCTION IN A UNIVERSAL SERIAL BUS (USB) LOW SPEED OUTPUT DRIVER

FIELD OF THE INVENTION

The present invention relates to low speed drivers generally and, more particularly, to a low speed driver for use with the universal serial bus that provides improved crossover performance and/or monotonicity.

BACKGROUND OF THE INVENTION

The universal serial bus (USB) has a variety of operating modes that allow a number of computer peripherals to be connected to a generic port. One of the modes of a USB device is a low speed mode. While operating in the low speed mode, the outputs of a USB device are generally very slow transitioning signals. One design criteria involved with USB devices is that there may be a large variation in the load placed on the device. As a result, the USB device must be designed to provide the proper speed at the output across wide load variations.

The USB specification calls for controlled differential rise and fall times over a 7:1 range of load capacitances (i.e., from 50 pf to 350 pf) for operation in the low speed mode. The USB specification also requires that the differential outputs cross between 1.3 and 2.0 volts over the entire load range. A particular design problem in implementing an output driver to meet the crossover specification occurs since the negative output signal generally contains a 1.5 KΩ pull-up resistor at the output. The pull-up resistor causes the negative output to rise more quickly than the positive output causing an imbalance in the output crossovers. The crossovers are also effected by process and temperature variations. As a result, the circuit must not only change the signal delay, but must also track the process and temperature variations.

Referring to FIG. 1, a conventional USB driver circuit 10 is shown which implements operational amplifiers 12 and 14 to control the transitioning of the output signal. The circuit 10 generally requires the use of the operational amplifier 12 and the operational amplifier 14 to control the signal presented at an output pad 16. The circuit 10 also requires a variety of transistors, a bias circuit 18, a predriver circuit 20 and a clamp circuit 22. More information regarding the circuit of FIG. 1 may be found in the paper "Design Guide For A Low Speed Buffer For The Universal Serial Bus," published in December 1996, the relevant sections which are hereby incorporated by reference.

Each universal serial bus device has two outputs, a plus output and a minus output. The circuit 10 would have to be implemented, at a minimum, at each of the plus and minus outputs of each device. In an application that provides a number of universal serial bus outputs on a single device, the number of instances that the circuit 10 would have to be duplicated increases accordingly. As a result, it is desirable for the number of components in the circuit 10 be kept to a minimum in order to reduce the overall area required to implement the plurality of required buffers at the various outputs.

The USB specification also requires that the differential outputs be monotonistic (i.e., smoothly transitioning). When switching from a HIGH (e.g., "1") to a LOW (e.g., "0") in low speed mode, the pull-up resistor on the D− output signal generally causes the D− output to pull toward the power supply voltage until the NMOS pull-down transistor reaches its threshold voltage. This may cause a variation in voltage, or a "bump," to occur on the output. It is generally desirable to reduce the bump at the output.

SUMMARY OF THE INVENTION

The present invention concerns a circuit comprising a comparator circuit and a control circuit. The comparator circuit may be configured to present an output signal in response to (i) a reference current and (ii) a control current. The control circuit may be configured to generate the control current in response to (i) a first current source configured to present a fixed portion of the control current, (ii) a second current source configured to present a variable portion of the control current and (iii) a sense transistor. The second current source generally responds to a level of said control current.

The objects, features and advantages of the present invention include providing a gated current source that reduces output buffer delay, reduces spikes in the output voltage and reduces the overall chip area needed to implement the invention.

Other objects, features and advantages of the present invention include providing a circuit that closely matches the threshold voltage changes in a USB device due to process variations, provides rapid state changes, provides a delay that may be a function of load, and provides a delay as a function of process changes.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention concerns a threshold-dependent gated current source configured to compensate for the delay associated with an output buffer. A comparator may be used to detect when one of the outputs has reached a threshold current. A signal may then be sent to a transistor or other switching device to disable a current source compensation circuit. When the differential output buffer begins its transition for the D− output, the D+ output will begin to transition to a HIGH state. Next, the D− output will begin to transition to a LOW state. The pull-up transistor on the D− output generally shuts off at the start of the cycle. The current source is generally disabled when the transistor reaches its turn on threshold voltage. Another example of an output buffer delay reduction circuit may be found in copending U.S. Ser. No. 08/935,350, which is hereby incorporated by reference in its entirety.

Figure 1:
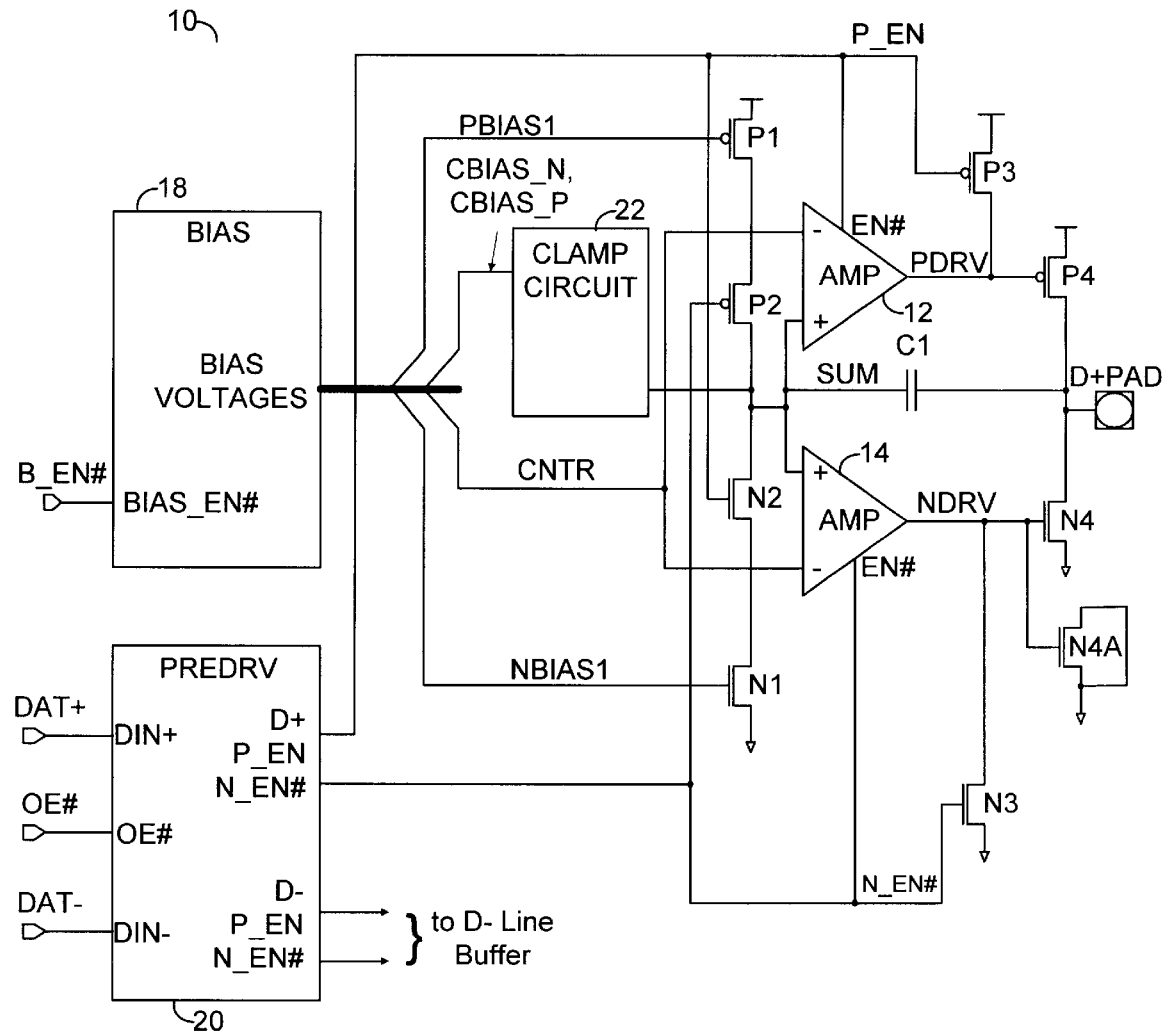
FIG. 1 is a block diagram of a conventional buffer for use in a low speed application USB.
Figure 2:
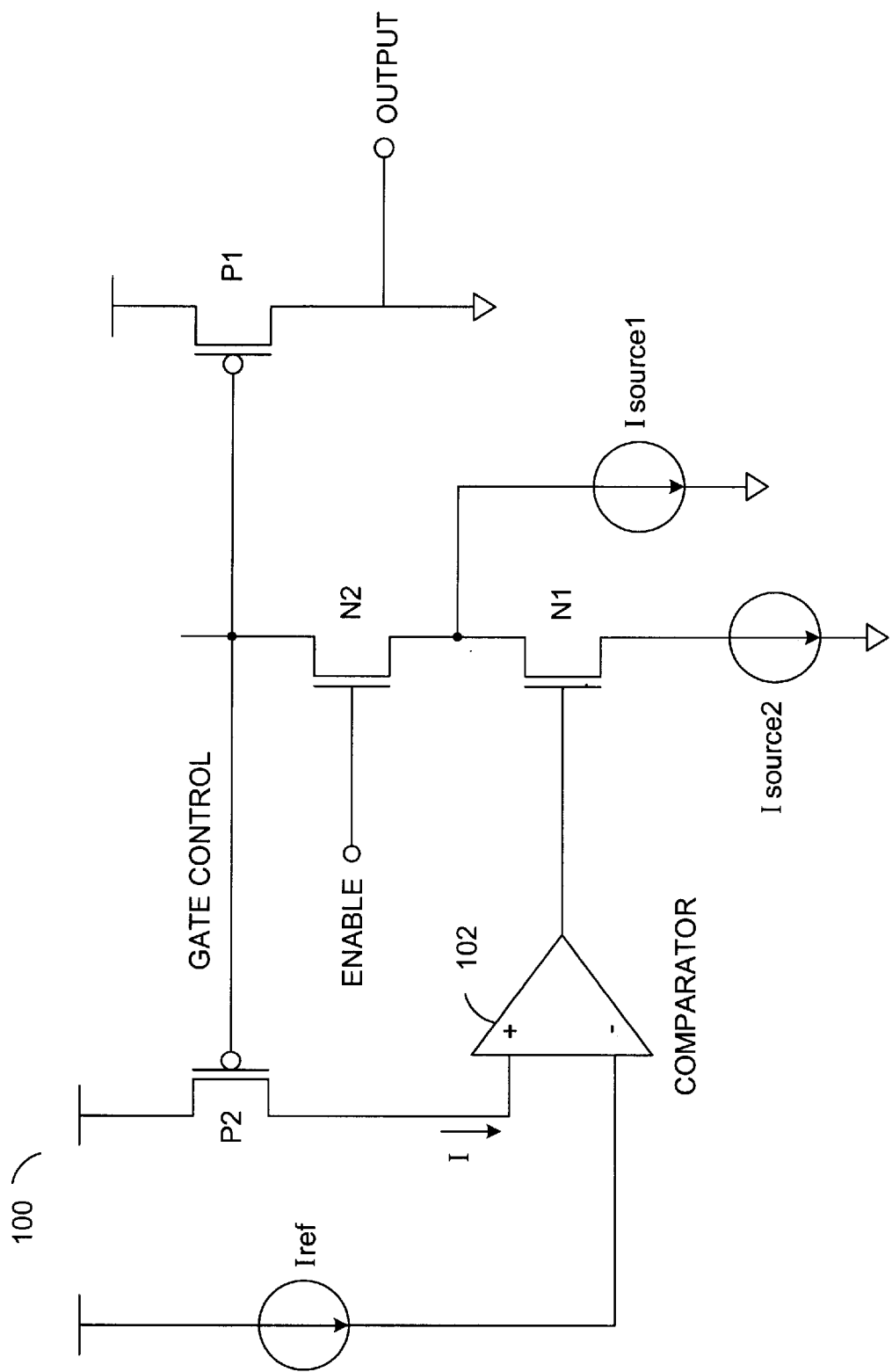
FIG. 2 illustrates a circuit diagram of a preferred embodiment of the present invention.

Referring to FIG. 2, a circuit 100 is shown in accordance with a preferred embodiment of the present invention. The circuit 100 generally comprises a transistor P1, a current source Isource1, a current source Isource2, a reference current source Iref, a comparator 102, a transistor N1, a transistor N2 and a transistor P2. The transistors P1 and P2 may each have sources connected to a supply voltage. The drain of the transistor P1 is generally coupled to the output. The drain of the transistor P2 may be coupled to a positive input of the comparator 102. The gate of the transistor P2 is generally coupled to the gate of the transistor P1 as well as to the drain of the transistor N2 and may present a gate control voltage. The output of the comparator 102 is generally coupled to the gate of the transistor N1. The source of the transistor N1 is generally coupled to ground through the current source Isource2. Similarly, the source of the transistor N2 is generally coupled to ground through the current source Isource1. The source of the transistor N2 is also generally coupled to the drain of the transistor N1. The current source Isource1 may be a fixed current that may comprise, in one example, a static current. The current source Isource2, may be a variable current that may comprise, in one example, a dynamic current.

Figure 3:
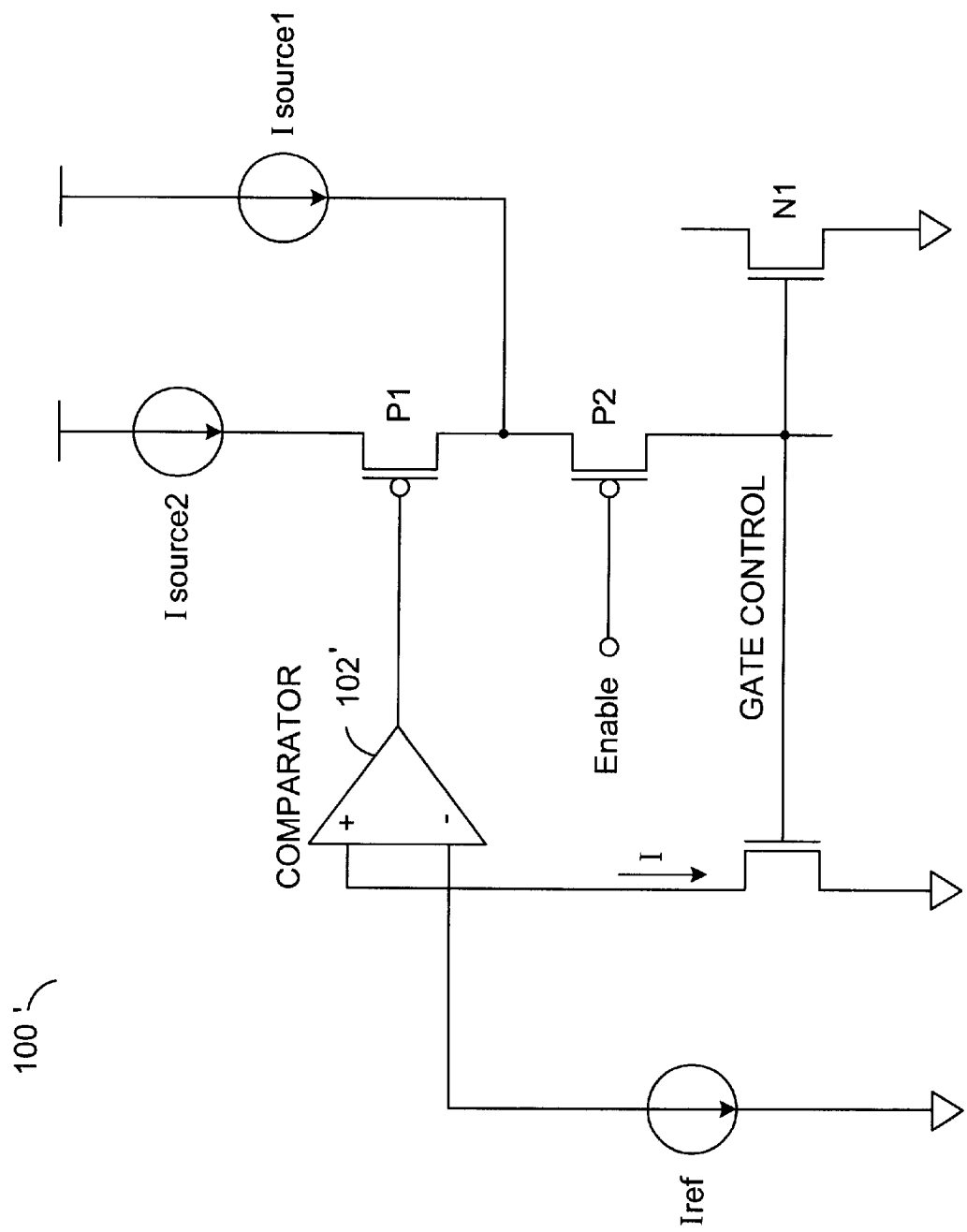
FIG. 3 illustrates a circuit diagram of an alternate implementation of the present invention.

Referring to FIG. 3, an alternate implementation of the circuit 100 is shown as the circuit 100'. The circuit 100' generally comprises a current source Isource1, a current source Isource2, a reference current Iref, a transistor N1, a transistor N2, transistor P1, a transistor P2 and a comparator 102'. The current reference Iref is generally coupled to the negative input of the comparator 102'. The source of the transistors N1 and N2 are generally coupled to ground. A positive input of the comparator 102' is generally coupled to the drain of the transistor N2. The gate of the transistor N1 and N2 are generally coupled to the drain of the transistor P2. The comparator 102' is generally coupled to the gate transistor P1. The source of the transistor P1 is generally coupled to a supply voltage through the current source ISource2. The drain of the transistor P1 is generally coupled to the source of the transistor P2 as well as to the supply voltage through the current source Isource1.

The comparator 102, generally generates an output signal that may drive the gate of the transistor P1. The current source Isource1 may be used as part of a slew rate control circuit. The current source Isource2 is generally used to quickly drive the gate voltage to a threshold value. The current source Isource1 and the current source Isource2 may be combined as a control circuit to present the gate control voltage. Once the gate control voltage has reached the threshold voltage Vth, the transistor N2 turns on which may cause the comparator 102, to disable the current source Isource2. The disabling of the current source Isource2 may prevent the disruption of the slew rate control function.

The reference current Iref generally establishes a reference current that may be presented to the negative input of the comparator 102. The reference current Iref is generally a small current with respect to the current that may flow through the transistor N2. The transistor N2 may be used as a control transistor to activate the circuit 100' during a particular cycle. The transistors N1 and N2 are formed with the same process and generally have similar operating characters. As a result, as current begins to flow through the transistor N1 to the output, an equal amount of current will generally flow through the sense transistor N2. This current matching may provide an accurate method for detecting when the output transistor N1 has reached a threshold voltage. Once the current flows through the transistor N2 and exceeds the reference current, the additional current source Isource2 may be switched out of the circuit 100 (or 100').

Figure 4:
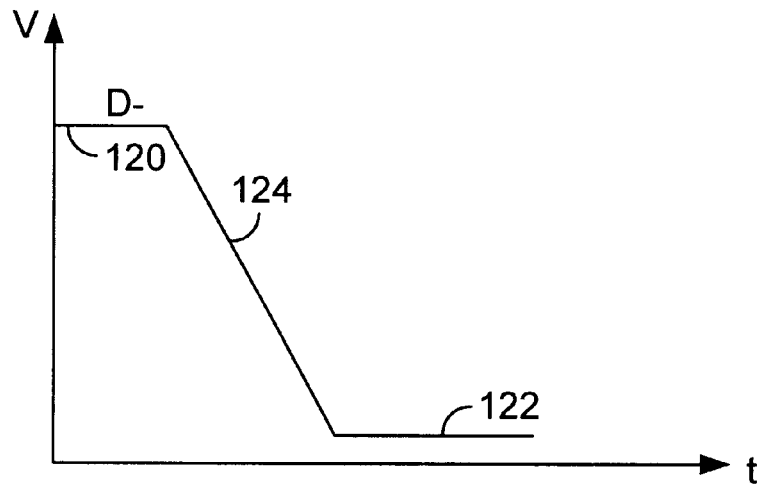
FIG. 4 is a graph illustrating an ideal high to low transition.

Referring to FIG. 4, an ideal transition between a logic high and a logic low at the D– output is shown. The logic high portion is generally shown by the trace 120, the logic low is generally shown by the trace 122 and the transition period is generally shown by the trace 124. The change between the trace 120 and 124 is generally an abrupt change, not exhibiting either a bump or other discontinuity. While this may be the ideal situation, the gradual curve may provide acceptable results that may be properly used by additional devices connected to the D– output.

Figure 5:
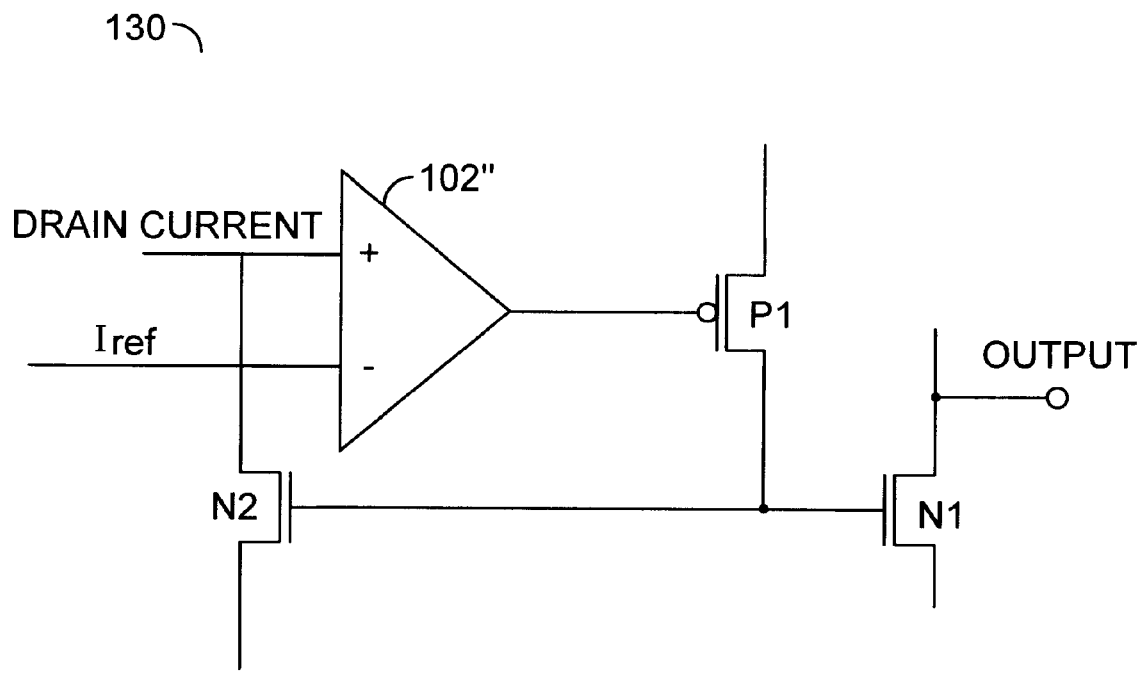
FIG. 5 illustrates one embodiment of the comparator portion of the circuits of FIGS. 3 and 4.

Referring to FIG. 5, a diagram of a gate control circuit 130 is shown. The gate control circuit 130 generally comprises a comparator 102", a transistor P1 and a transistor N1. The gate control circuit 130 generally represents the components necessary to control the transistor P1, which may be used to turn on the current source Isource2 described in connection with FIGS. 2 and 3.

The drain current Id, generally presented to the comparator 102" may be described by the following equation:

$$Id = (Vgs - Vt)^2,$$

where K' generally comprises a process constant.

A problem associated with designing a circuit to reduce the delay in a buffer occurs when the transistor voltage threshold changes over processing temperature conditions (i.e., process corners). Therefore, the circuit must generally be designed not only to reduce delay, but also to track the process variations. The reference current Iref generally establishes the reference current. The reference current Iref generally tracks the threshold current at the gate of the transistor N1 (of FIG. 2). The operation of the circuit 130 may be viewed as feedback created between the output and the positive input of the comparator 102. This feedback is generally compared to the reference current Iref and may reduce the stored charge at the gate of the transistor P1.

While the invention has been particularly shown and described with reference to the preferred embodiments thereof, it will be understood by those skilled in the art that various changes in form and details may be made without departing from the spirit and scope of the invention.

We claim:

1. A circuit comprising:
   a comparator circuit configured to present an output signal in response to (i) a reference current and (ii) a control current; and
   a control circuit configured to generate said control current in response to (i) a first current source configured to present a fixed portion of the control current, (ii) a second current source configured to present a variable portion of the control current and (iii) a sense transistor coupled between said output signal and said control current, said second current source being configured to respond to a level of said control current.

2. The circuit according to claim 1, wherein said fixed portion of said control current comprises a static current and said variable portion of said control current comprises a dynamic current.

3. The circuit according to claim 1, wherein said second current source is controlled by a transistor having a threshold voltage corresponding to said control current.

4. The circuit according to claim 1, wherein said output signal is presented to an output driver circuit of a Universal Serial Bus device.

5. The circuit according to claim 1, wherein said sense transistor provides compensation for process variations.

6. The circuit according to claim 1, wherein said output signal controls a pull transistor of an output driver circuit.

7. The circuit according to claim 1, wherein said circuit comprises a current sensing gated current source configured to provide delay reduction in a universal serial bus output driver.

8. A circuit comprising:

means for generating an output signal in response to (i) a reference current and (ii) a control current; and means for generating a static portion of said control current; and means for generating a dynamic portion of said control current in response to a level of said control current; and means for generating said reference current in response to an output of a sense transistor coupled between said output signal and said control current.

9. The circuit according to claim 8, wherein said control signals presented to a pull transistor of an output driver circuit of a Universal Serial Bus device.

10. A method for compensating for propagation and process variations in an output driver comprising the steps of:

comparing (i) a reference current and (ii) a control current to generate an output signal;

generating a first current representing a fixed portion of said control current; and generating a second current representing a variable portion of said control current, wherein said second current is generated in response to a level of said control current; and generating said reference current in response to an output of a sense transistor coupled between said output signal and said control current.

11. The method according to claim 10, further comprising the step of:

disabling said step of generating said second current in response to an enable signal.

12. The method according to claim 10, wherein said fixed portion of said control current comprises a static current and said variable portion of said control current comprises a dynamic current.

13. The method according to claim 10, further comprising the step of:

controlling a pull transistor of an output driver circuit of a Universal Serial Bus device with said output signal.

14. The method according to claim 13, further comprising the step of:

adjusting the reference current to correspond to a threshold of said pull transistor.

* * * * *